United States Patent
Tsai et al.

(10) Patent No.: US 7,037,628 B2
(45) Date of Patent: May 2, 2006

(54) METHOD OF A FLOATING PATTERN LOADING SYSTEM IN MASK DRY-ETCHING CRITICAL DIMENSION CONTROL

(75) Inventors: Fei-Gwo Tsai, Tainan (TW); Wei-Zen Chou, Toughe (TW); Zong-Xian Tsai, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 143 days.

(21) Appl. No.: 10/694,426

(22) Filed: Oct. 27, 2003

(65) Prior Publication Data

US 2005/0089765 A1    Apr. 28, 2005

(51) Int. Cl.
G01F 9/00 (2006.01)
(52) U.S. Cl. .......................................................... 430/5
(58) Field of Classification Search ................ 430/5, 430/30, 312, 323; 716/19–21; 216/12
See application file for complete search history.

(56) References Cited

U.S. PATENT DOCUMENTS

| | | | | |
|---|---|---|---|---|
| 5,278,105 | A | 1/1994 | Eden et al. | 437/250 |
| 5,899,706 | A | 5/1999 | Kluwe et al. | 438/129 |
| 6,281,049 | B1 | 8/2001 | Lee | 438/129 |
| 6,475,684 | B1 * | 11/2002 | Ki | 430/30 |
| 2004/0038139 | A1 * | 2/2004 | Mui et al. | 430/30 |

* cited by examiner

Primary Examiner—S. Rosasco
(74) Attorney, Agent, or Firm—Thomas, Kayden, Horstemeyer & Risley (57) ABSTRACT

The invention calculates an optimum etch recipe for etching a product pattern in an opaque material of a photolithographic exposure mask with the objective of achieving optimum CD performance of the product pattern. If, for this optimum etch recipe, the optimum CD performance cannot be achieved, dummy patterns are added to the mask that is used to etch the opaque material. If this latter approach still cannot achieve optimum CD performance, the product pattern to which the dummy pattern has been added is separated into two patterns such that one of these two patterns provides a Cr loading that assures optimum CD performance of the product pattern.

13 Claims, 6 Drawing Sheets

Pattern A  Pattern B  Pattern C

FIG. 8

METHOD OF A FLOATING PATTERN LOADING SYSTEM IN MASK DRY-ETCHING CRITICAL DIMENSION CONTROL

BACKGROUND OF THE INVENTION (1) Field of the Invention

The invention relates to the fabrication of integrated circuit devices, and more particularly, to a method of pattern loading on a photolithographic exposure mask such that effects of different etching bias while applying the same dry-etching parameters are eliminated.

(2) Description of the Prior Art

For the creation of semiconductor devices a large number of interactive device elements are created in or over the surface of a substrate.

After a layer of semiconductor material, such as a layer of dielectric or a layer of insulating material, has been deposited over a substrate, this layer has to be patterned and etched in order to selectively remove the layer and in so doing to create a desired pattern in the remaining layer of semiconductor material.

For this purpose, the layer is typically coated with a layer of photoresist, which is exposed through a photolithographic exposure mask over the surface of which a positive or negative image of the desired pattern has been created. In this manner, the created photoresist mask exposes the surface of the underlying layer that must be removed and blocks the underlying layer where this layer is to remain in place. The underlying layer may for instance be a layer of metal such as aluminum, copper, tungsten or any semiconductor material that is typically used for the creation of device elements or for the creation of interconnecting elements thereof.

The removal of the material that is exposed by the photoresist mask is typically performed by applying an etch of the exposed underlying material. This etch is determined by a number of etch parameters such as etchant used, the flow rate of the etchant, the temperature and pressure applied during the etch and, not insignificantly, the time of the etch.

It is clear that the longer the etch is applied the more of the exposed underlying material will be removed. It is thereby well known in the art that the etch removal rate of the underlying material depends on the pattern density of the material that needs to be removed, whereby smaller pattern features require a larger etch time for removal of the etched layer than larger pattern features etched in the underlying layer. This latter effect is known in the art as the loading effect, whereby it is clear that this loading effect can lead to serious problems of uneven etch removal rates over the surfaces of a substrate.

One of the methods that are used to counter the loading effect is to extend etch time so that smaller feature size material can be removed in this extended etch time. This however presents the problem of photoresist punchthrough, undesirably exposing parts of the underlying layer and etching the layer outside the boundaries of the desired pattern.

In addition, the non-uniform removal of etched layers may affect deposition rates of subsequently there-over deposited layers of semiconductor material. For instance, the deposition of a layer of passivation material over the surface of a patterned and etched layer of metal is inversely proportional to the thickness of the layer of metal over which the layer of passivation is deposited.

The negative impact of the above indicated loading effect becomes even more of a challenge for applications where different types of devices area are created over one substrate. For these applications, feature and device densities vary in an even more pronounced manner over the surface of the substrate in view of the different topography that is in existence during the processing of the substrate.

It is therefore desirable to have a method that allows for the creation of semiconductor devices and device features having different densities by applying one process recipe that is equally applicable to these semiconductor devices and device features.

U.S. Pat. No. 6,281,049 B1 (Lee) shows a mask process with dummy patterns involving macro loading.

U.S. Pat. No. 5,899,706 (Kluwe et al.) shows a process to reduce loading variation during etching.

U.S. Pat. No. 5,278,105 (Eden et al.) shows a method for a device with dummy lines in active layers.

SUMMARY OF THE INVENTION

A principal objective of the invention is to provide a method that compensates for loading effects in etching patterns of unequal density while using the same etch recipe.

In accordance with the objectives of the invention a new method of creating exposure features in a photolithographic exposure mask is provided. The invention starts by defining etch recipes for etching an opaque material over the surface of a substrate of a photolithographic exposure mask that optimally meet CD requirements for a range of fixed pattern loading A of for instance 20%, 50% and 80%. The invention then calculates the product's total Cr etch loading on the exposure mask and defines the residual or useless surface area of the exposure mask. If the defined, optimum etch recipe meets the pattern loading of for instance 20%, 50% and 80%, the exposure of the opaque material of the exposure mask is performed. If the defined, optimum etch recipe does not meet the pattern loading of for instance 20%, 50% and 80%, then the pattern loading of for instance 20%, 50% and 80% is tried to be achieved by adding dummy patterns in unused areas of the photoresist exposure mask. If this latter approach does not allow for meeting the Cr etch loading of for instance 20%, 50% and 80%, then the Cr loading pattern A is separated into parts B and C, such that pattern B meets Cr loading of 20%, 50% and 80% Cr, after which pattern B is applied to a first exposure process and pattern C is applied for a second exposure process.

DESCRIPTION OF THE PREFERRED EMBODIMENTS

A number of basic concepts will first be highlighted in preparation for the explanation of the invention.

The invention provides for modifying the pattern of the opaque material, such as chrome (Cr) that is provided over the surface of an exposure mask.

The invention has as an objective to enable the use of a standard process during which no additional control such as modification of the etch time is required in order to achieved acceptable Critical Diameter (CD) control of the pattern that is created using the exposure mask of the invention.

It is well known in the art that different pattern densities (or loading) of the layer of opaque material of a photolithographic exposure mask require different etch bias (or etch conditions) of the etch recipe that is applied for the patterning of the opaque material of the exposure mask. This bias can for instance comprise extending the etch time dependent on the pattern loading, with higher pattern loading (more patterned opaque material covering the substrate of the exposure mask) requiring a relatively longer etch time and lower pattern loading requiring a relatively shorter etch time.

Figure 1A:
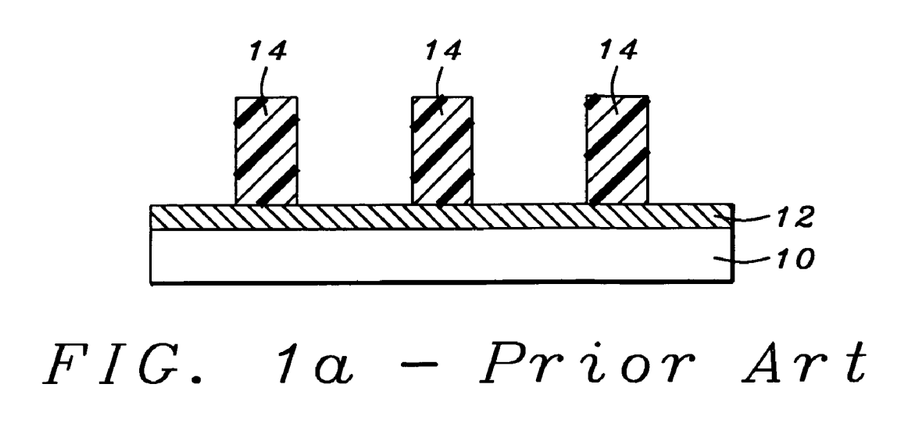
FIGS. 1a through 1c shows the effect of process bias when applying a sequence of conventional processing steps.
Figure 1B:
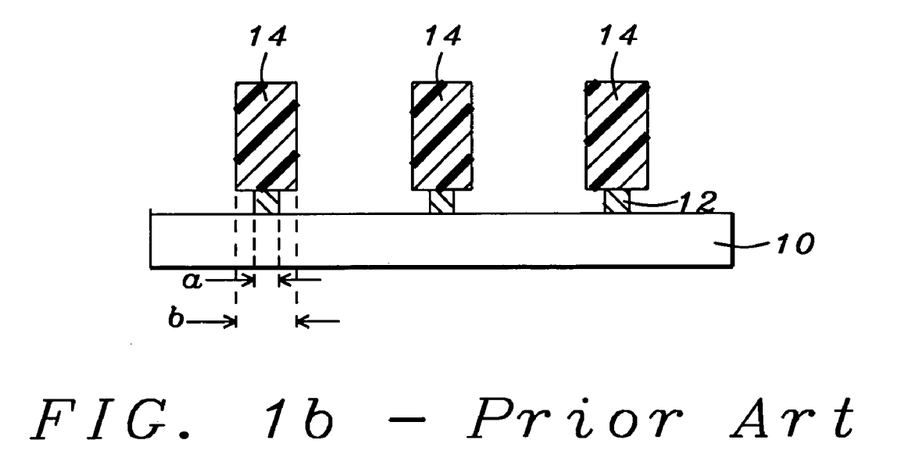
Figure 1C:
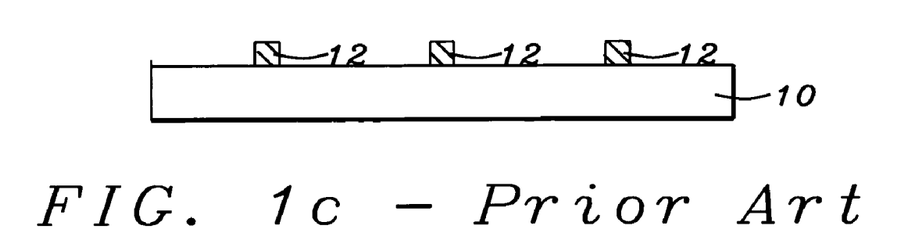

The sequence of processing steps represented in FIGS. 1a through 1c shows the effect of process bias, which refers to the bias of processing parameters, such as most notably etch time, that can be applied in order to control the results of the etch that is performed in order to create the pattern of opaque material over a substrate of a photolithographic exposure mask.

FIG. 1a shows the cross section of the substrate 10 of a photolithographic exposure mask, a layer 12 of opaque material such as chrome has been deposited over the substrate 10. This layer 12 is patterned by creating a photoresist exposure mask 14 over layer 12, using conventional methods of photoresist exposure and development.

In the cross section that is shown in FIG. 1a, the surface area of the photoresist mask 14 overlays 30% of the total surface area of the photolithographic exposure mask, which for instance may be a 6×6 inch mask. With the photoresist mask 14 covering 30% of the surface area of the exposure mask, the exposed chrome covers the remaining 70% of the exposure mask.

This exposed chrome of layer 12 is etched, resulting in the etched layer 12 of chrome that is shown in the cross section of FIG. 1b. It is clear from this latter cross section that an over-etch has occurred of the layer 12 of chrome, the parameters "a" and "b" relate to this overetch whereby the difference (b−a) is the process bias of the etch that is applied to the layer 12 of chrome.

The process bias than is the deviation from the ideal etch parameters of the openings created through the layer 12 of chrome, this deviation being introduced by the etch process. The etch of layer 12 modifies or affects the ideal etch parameters, a modification that is reflected in the process bias (b−a).

After the photoresist mask 14 is removed, the chrome pattern shown in cross section in FIG. 1c is obtained.

To compensate for the process bias, the etch process can be adjusted or "loaded" such that the ideal pattern is created in the layer of chrome. For the example that is shown in FIGS. 1a through 1c, this loading must result in a chrome pattern 12 that, like the photoresist pattern 14, covers 30% of the surface of the exposure mask.

It is clear that different patterns of opaque material have different pattern densities and can therefore be represented, in the previously used terminology, as having different dimensions of the openings created in the layer of chrome. These dimensions are for instance in the range of about 40 or 60 or 80 or 100 nm (nano-meter).

For conventional chrome etching to create a photolithographic exposure mask, it stands to reason that the pattern that is created in the opaque material is optimized for one pattern density.

For instance, it stands to reason that the pattern created in the layer of chrome is optimized for 100 nm photolithographic exposure in order to create a mask that can be used to create device features having a cross section of 100 nm.

The process bias, which comprises all the processing parameters that determine the results of the etch of the layer of opaque material such as chrome, therefore is such that this mask can be used to create a variety of patterns having elements with a cross section of 100 nm. For such a process, directed at 100 nm technology, the CD control of the created pattern of elements of a semiconductor device can be controlled such that acceptable results are achieved.

Further applying the above line of reasoning, if a process is created for a 40 nm technology, being referred to as a 40% loading process, then this process has to be adjusted by for instance extending the etch time of the layer of opaque material if this process is applied to creating an exposure mask for 60 nm technology and thereby over-etching the layer of chrome. This has the result that CD control of the created chrome pattern is not as good as the CD control of for instance the original 40 nm technology mask.

The invention addresses the latter concerns, as follows:

A number, for instance three, different chrome etch processes are established, referred to as etch recipes K, L and M Chrome etch recipe K is optimized for 20% chrome loading (the etched chrome covers 20% of the total surface of the exposure mask) with acceptable CD uniformity and macro-loading results having a process bias for, for instance, 60 nm technology Chrome etch recipe L is optimized for 50% chrome loading (the etched chrome covers 50% of the total surface of the exposure mask) with acceptable CD uniformity and macro-loading results having a process bias for the selected 60 nm technology Chrome etch recipe M is optimized for 80% chrome loading (the etched chrome covers 80% of the total surface of the exposure mask) with acceptable CD uniformity and macro-loading results having a process bias for the selected 60 nm technology.

Having established the three etch recipes K, L and M, these etch recipes can be applied to pattern densities within the 60 nm technology that have chrome loading factors that are different from the loading factors that have been used to optimize recipes K. L and M such as a loading factor (chrome pattern density as reflected by the surface area of the exposure mask that is covered by the patterned layer of opaque material such as chrome) of for instance 58% or 75%.

A photolithographic exposure mask can, for purposes of the invention, be divided into "forbidden" areas and "useless areas". The forbidden areas are the areas that contain device features and such elements as alignment markers, mask Identification numbers, and the like.

Based on the transparency of the pattern that is created over the surface of the exposure mask, it is clear that the etch ratio can be controlled. It is basic for instance that if no light passes through a surface, the underlying layer of photoresist will not be exposed and will be rendered soluble or insoluble dependent on whether negative working or positive working photoresist is used.

By therefore controlling the amount of light that is allowed to pass through a patterned layer of chrome, which has been created over the surface of a photolithographic exposure mask, that is by controlling the etching of the chrome that is used for the opaque material over the surface of the mask, the etch ratio of the surface that is exposed through the mask can be controlled.

In creating a photolithographic exposure mask, which uses chrome as the opaque material, the term chrome loading refers to the ratio of the amount of chrome that is removed from the surface of the exposure mask for the creation of the exposure pattern over the surface thereof.

It is therefore not unreasonable to state that, for etched Cr areas, a Cr etch ratio of 99% can be achieved, indicating that most of the chrome has been removed from the substrate of the photolithographic exposure mask. For other areas, a Cr etch ration of 3.3% can be achieved, indicating that most of the chrome remains in place over the substrate of the photolithographic exposure mask.

In other words: the amount of Cr that is removed from the surface of an exposure mask determines and can therefore be used to control the etch of an exposed surface.

Figure 2:
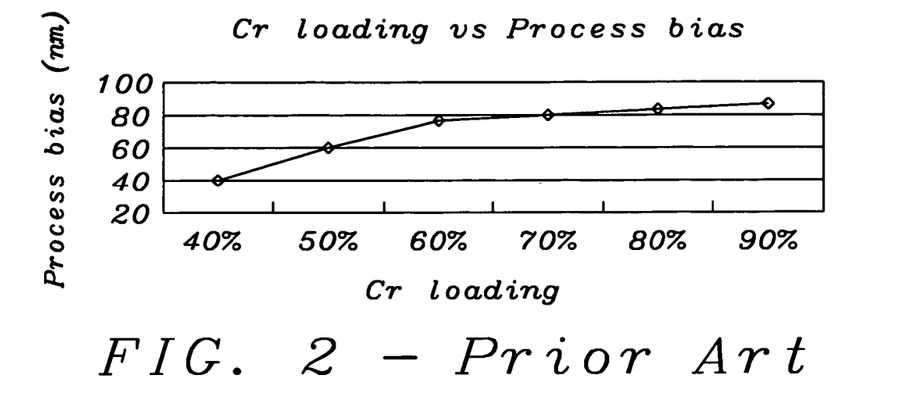
FIG. 2 shows a relationship between Cr Loading vs. Process Bias for a conventional, constant etch process.

FIG. 2 shows the relationship between Cr Loading vs. Process Bias for a constant etch process. From the relationship shown in FIG. 2 it is clear that Process Bias varies as a function of Cr Loading. If the same etch results are to be obtained, while applying the same etch recipe, than the Process Bias has to be adjusted based on the Cr Loading, that is based on the way in which the Cr pattern is created (expressed as Cr loading) over the surface of the exposure mask.

Figure 3:
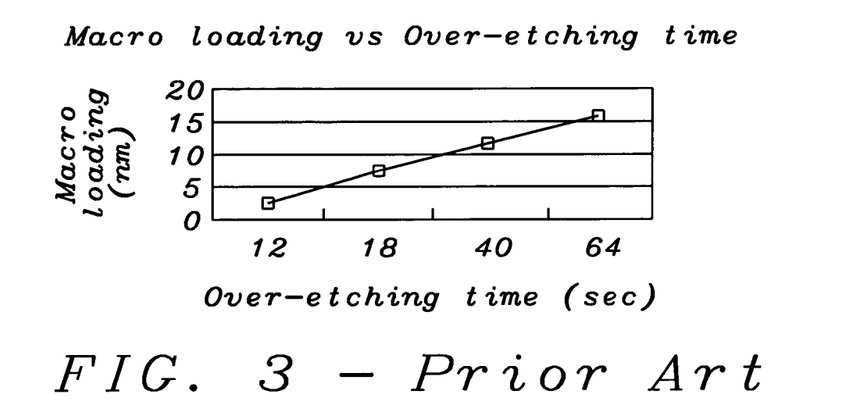
FIG. 3 shows a conventional relationship between Macro Loading and required Over-etch time if the same etch results want to be achieved using the same etch recipe.

FIG. 3 shows the relationship between Macro Loading and required Over-etch time if the same etch results want to be achieved using the same etch recipe. From the curve shown in FIG. 3 it can be concluded that, with increased Macro loading, the Over-etch time has to be extended in a linear relationship in order to achieve the same etch results.

The invention further makes use of the observation that an exposure mask, over the surface of which a Cr pattern has been provided, can be separated into two different surface areas, of which a first surface area is identified as a forbidden surface area and a second surface area is identified as a useless surface area.

Figure 4:
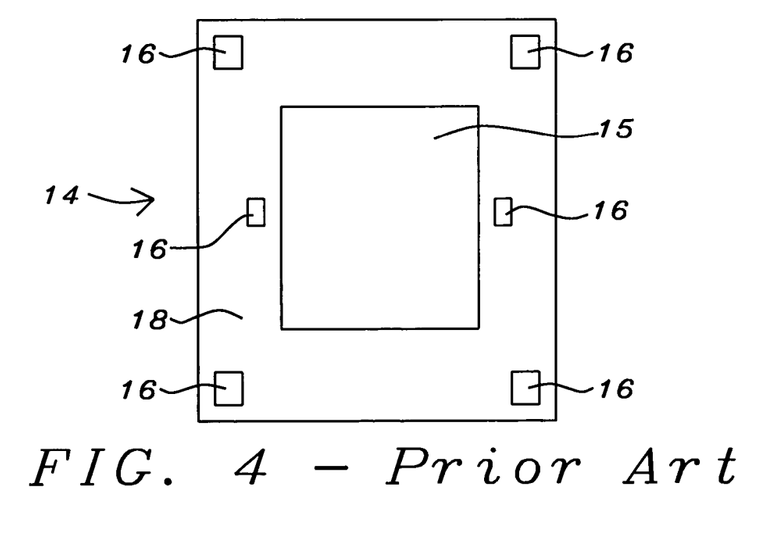
FIG. 4 shows a top view of an exposure mask, highlighting therein and useless surface areas.

These two surface areas are highlighted in FIG. 4, which shows a top view of an exposure mask 14, forbidden areas have been highlighted as surface areas 15 and 16, useless surface areas have been identified as surface area 18. The forbidden surface area 15 comprises the desired exposure pattern, the forbidden surface areas 16 are surface areas over which mask features such as alignment markers and some functional patterns have been provided.

From the above explanation it is clear that the following aspects apply to the creation of a photolithographic exposure mask:

the desirability of a known and fixed recipe that is applied for the etch of the layer of opaque material that is provided over the substrate of the mask optimum or best performance etch requirements of the opaque layer are determined by optimum or best uniformity of the CD of the pattern created in the layer of opaque material of the exposure mask an optimum fixed etch recipe can be determined for different patterns of the layer of opaque material such as chrome the latter also referred to as the Cr loading factor an etch recipe for the etch of the layer of opaque material meets CD performance criteria; etch recipes can therefore be classified accordance to the CD performance criteria etch recipes can, for different chrome loading factors, be grouped based on required CD performance criteria a number of different etch recipes can be established that, for Cr loading factors of for instance 20%, 50% and 80%, meet a particular CD performance criteria, and different CD performance criteria will therefore result in different etch recipes for a particular range of Cr loading factors.

Figure 5:
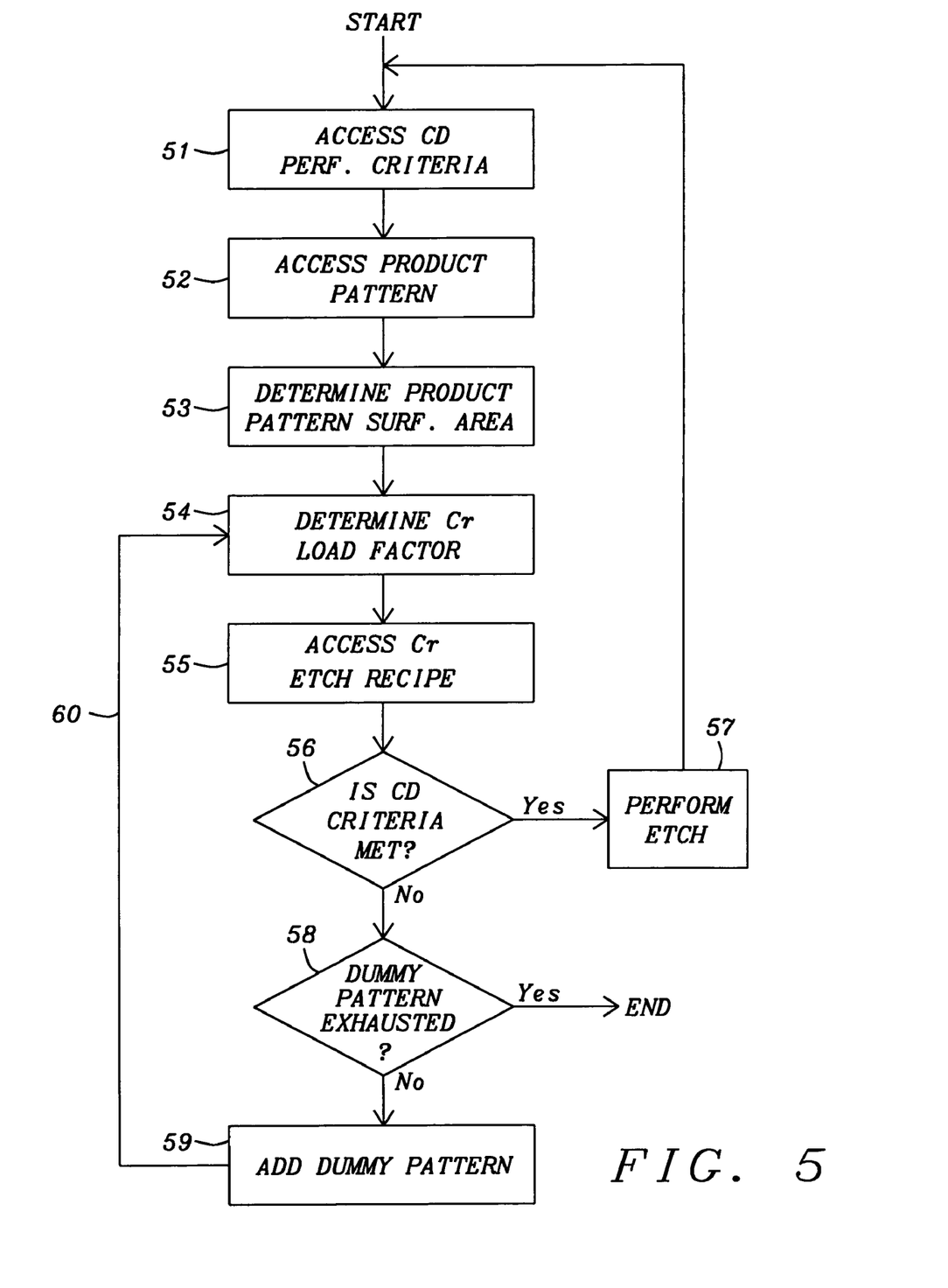
FIG. 5 shows a flowchart of the steps of the invention for the creation of a pattern of opaque material over the substrate of a photolithographic exposure mask.

Keeping the above explanation in mind, the invention provides for the following method for the creation of a pattern of opaque material over the substrate of a photolithographic exposure mask. The flowchart for these steps is shown in FIG. 5.

1. A CD performance criteria is provided as input to the software support function of the invention, step 51, FIG. 5
2. The product pattern that is to be created in the opaque layer of the exposure mask is accessed; this product pattern may comprise exposure patterns, mask ID, mask alignment marks, etc., that is all the data that is required to create an exposure mask, step 52, FIG. 5
3. The surface area (A) of the product pattern is determined, step 53, FIG. 5
4. Determine, based in the accessed product pattern, the Cr loading factor (representative of the Cr pattern), step 54, FIG. 5
5. Access the etch recipe that meets the CD performance criteria for the determined Cr loading factor (representative of the Cr pattern), step 55, FIG. 5; this etch recipe is valid for the calculated Cr loading factor or for a Cr loading factor that is within determined limits of the Cr loading factor; for instance the loading factor may be within a range of for instance 15–25%, counting as Cr loading factors that closely resemble conditions for a Cr loading factor of 20%; the range of Cr loading factors suggests that the CD performance criteria will be met by etch processing conditions that are, for a given Cr loading factor, close to etch processing conditions of the ideal or center Cr loading factor
6. If CD performance criteria is met by the accessed etch recipe, the etch is performed, steps 56, 57, FIG. 5
7. If the CD performance criteria is not met by the accessed etch recipe, add dummy patterns in the dummy area of the mask, steps 56, 58, 59, FIG. 5
8. Re-calculate the Cr loading factor, comprising the product pattern and the created dummy pattern, steps 59, loop 60, FIG. 5
9. Access a new etch recipe that meets the CD performance criteria for the re-calculated Cr load factor, step 55, FIG. 5
10. If CD performance criteria is met by the newly accessed etch recipe, the etch is performed, steps 56, 57, FIG. 5
11. If CD performance criteria is not met by the newly accessed etch recipe, return to entry 7 above, step 60, FIG. 5.

Figure 6:
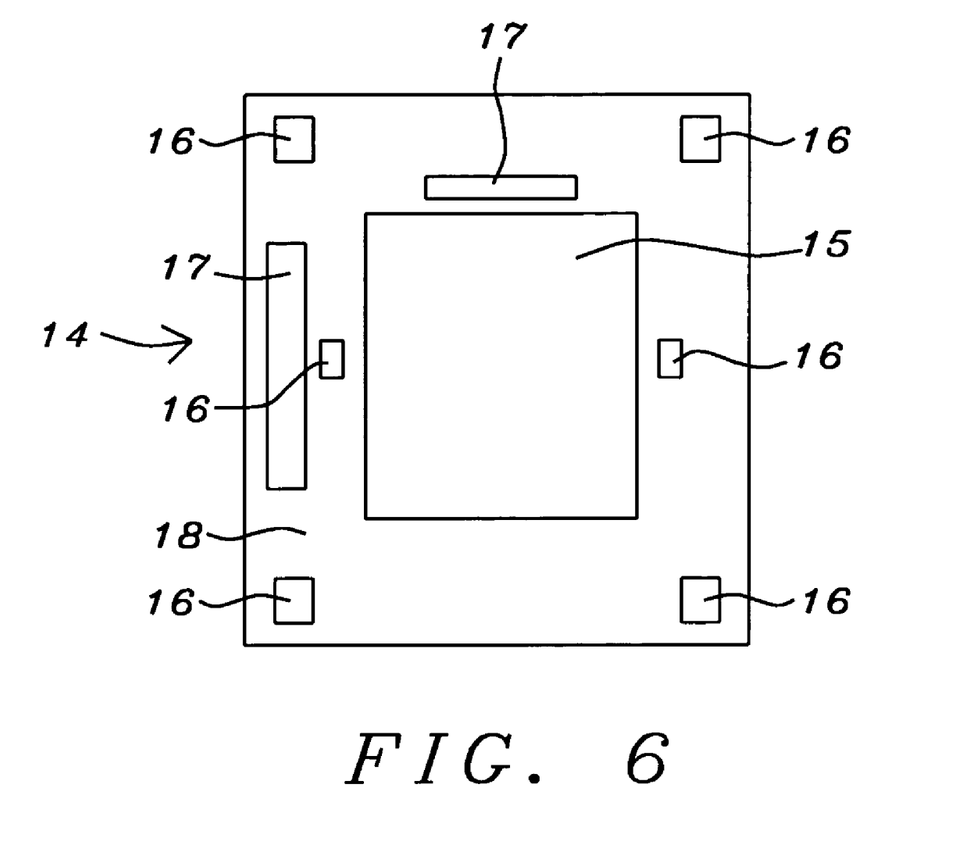
FIG. 6 shows elements of the exposure mask that have previously been shown in FIG. 4, in addition dummy patterns have been highlighted in the unused surface area over the surface of the exposure mask.

FIG. 6 shows elements of the exposure mask that have previously been shown in FIG. 4, in addition dummy patterns 17 have been highlighted in the useless surface are 18 over the surface of the exposure mask 14.

Alternately, the invention can be described as follows, using for this purpose the flow chart shown in FIG. 7.

1. The invention starts with the determination (or definition) of several dry-etch recipes, whereby these several dry-etch recipes provide optimum CD performance for a number of different fixed pattern loading recipes such as 20%, 50%, 80%, and the like
2. The invention continues by calculating the total Cr etch loading for a given product and, from this calculation, derives the residue or useless area on the photolithographic mask; these surface areas of the photolithographic mask have previously been defined using FIG. 4 for this purpose
3. The forbidden area of the surface of the exposure mask is defined by the Scanner and by the Product Pattern; once the forbidden area has been defined, the forbidden area A is calculated, step 70, FIG. 7
4. The invention next determines the pattern of the Cr etching by calculating a loading factor X, whereby X=(Cr etching area/total mask area)*100%, whereby 0%<X<100%, step 71, FIG. 7
5. X can be defined as being 20%, 50%, 80% or as being 18%, 35%, 75%; this latter determination depends on the performance of the actual chrome etch recipes and on the actual product pattern (the field of application of the actual or real production), step 72, FIG. 7
6. For values of X=20% or 50% or 80%, a first exposure is performed, step 73, FIG. 7
7. If, for the standard Cr etch recipes of respectively A=20%, B=50% or C=80%, respectively values of X<20% or <50% or <80% are obtained, it must be determined if enough dummy pattern can be provided to meet the criteria of X+Y=20% or 50% or 80%, whereby X+Y=[(Cr etching area+Y dummy etching areas)/total mask area] *100%, while Y=(Y dummy etching area/total mask areas)*100%, step 74, FIG. 7; the invention therefore provides for converting the different Cr etch recipes (for Cr etch loading products) into fixed etch recipes of for instance 20% or 50% of 80%
8. If the latter criteria can be met with the dummy pattern the second exposure is performed, step 75, FIG. 7, and
9. If the latter criteria cannot be met, meaning that X+Y is not equal to (also indicated in FIG. 7 as <>) 20% or 50% or 80%, the original pattern A is (must be) separated into pattern B and pattern C, step 75, FIG. 7; if, for instance, pattern A=39% and the invention obtains, by the above highlighted pattern sizing, a C pattern equal to 19%, by subtracting the C pattern (of 19%) from the A pattern (of 39%) a B pattern of 20% can be obtained, steps 77, 78, FIG. 7.

Figure 7:
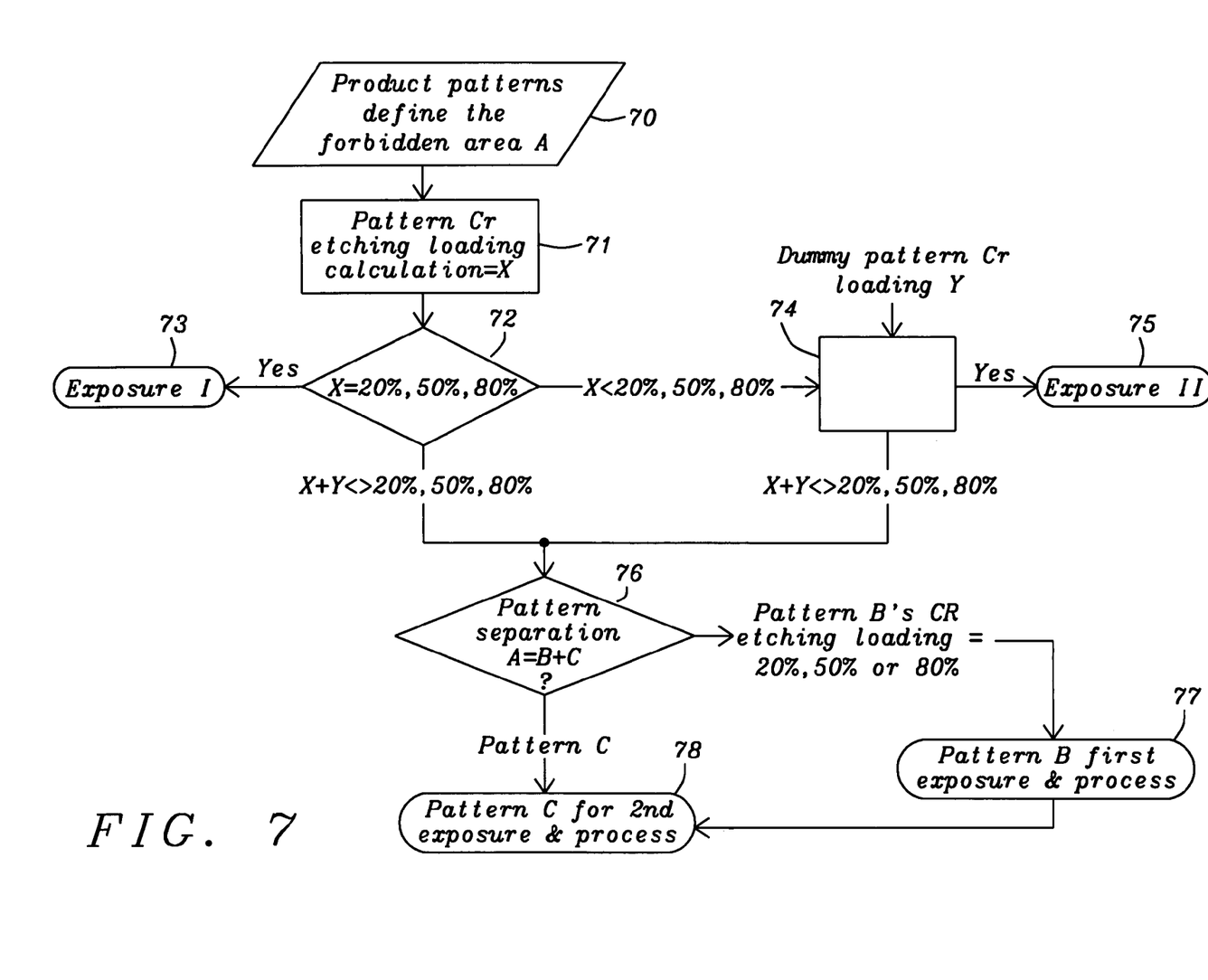
FIG. 7 shows an alternate flowchart of the steps of the invention for the creation of a pattern of opaque material over the substrate of a photolithographic exposure mask.
Figure 8:
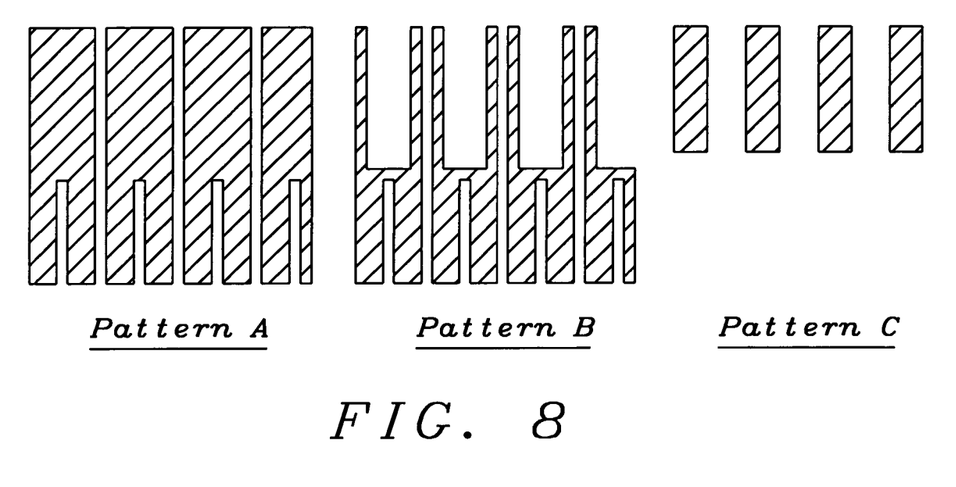
FIG. 8 shows patterns of the invention.

The invention can be further highlighted using FIG. 8 for this purpose, wherein is shown, for conditions whereby X+Y is not equal to (also indicated in FIG. 7 as <>) 20% or 50% or 80%:

A pattern A, which is the final or combined pattern that is created over the surface of a substrate of a photolithographic exposure mask A pattern B, which is representative of the previously highlighted X=20% or 50% or 80% requirement; this pattern B is applied for a first exposure as highlighted in block 77 of FIG. 7

A pattern C, which is representative of the previously highlighted X=20% or 50% or 80% requirement; this pattern C is applied for a second exposure as highlighted in block 78 of FIG. 7, and The addition of pattern C to pattern B results in the final or combined pattern A that is created over the surface of a substrate of a photolithographic exposure mask.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating a pattern in a layer of opaque material of a photolithographic exposure mask, comprising:
    defining an etch recipe for etching a product pattern A in an opaque material over a substrate of a photolithographic exposure mask that optimally meets Critical Diameter (CD) requirements of the product pattern, said etching a product pattern comprising a photoresist exposure mask;
    calculating the product pattern total Cr etch loading on the exposure mask;
    defining a residual or useless surface area of the exposure mask;
    if the defined, optimum etch recipe meets the optimal Critical Diameter (CD) requirements, the exposure of the opaque material of the exposure mask is performed;
    if the defined, optimum etch recipe does not meet the optimal Critical Diameter (CD) requirements, then the Cr etch loading is modified by adding dummy patterns in unused areas of the photoresist exposure mask;
    if the addition of dummy pattern to the product pattern does not meet the Cr etch loading, then the Cr loading pattern A is separated into two parts B and C, such that pattern B meets Cr loading requirements, after which pattern B is applied to a first exposure process and pattern C is applied to a second exposure process.

2. The method of claim 1, wherein the defining etch recipes for etching an opaque material comprises a range of fixed pattern loading of 20%, 50% and 80%.

3. A method for the creation of a pattern of opaque material over the substrate of a photolithographic exposure mask, comprising:
    providing a CD performance criteria;
    accessing a product pattern to be created in an opaque layer of an exposure mask;
    determining a surface area of the product pattern;
    determining, based in the accessed product pattern, a Cr loading factor over the substrate of the photolithographic exposure mask;
    accessing an etch recipe of the opaque layer of an exposure mask, the etch recipe meeting Critical Diameter (CD) performance criteria for the determined Cr loading factor, this etch recipe being valid for the calculated Cr loading factor or for a Cr loading factor that is within determined limits of the Cr loading factor;
    if CD performance criterion is met by the accessed etch recipe, the etch of the opaque layer is performed;
    if the CD performance criterion is not met by the accessed etch recipe, dummy patterns are added in a dummy area of the mask;
    re-calculating the Cr loading factor, comprising the product pattern and the created dummy pattern;
    accessing a new etch recipe of the opaque material, the new etch recipe meeting the CD performance criteria for the re-calculated Cr load factor;

etching, if CD performance criterion is met by the newly accessed etch recipe, the opaque material; and returning, if CD performance criteria is not met by the newly accessed etch recipe, to the preceding step of determining, based in the accessed product pattern, a Cr loading factor over the substrate of the photolithographic exposure mask.

4. The method of claim 3, wherein the product pattern comprises exposure patterns, mask ID and mask alignment marks.

5. The method of claim 3, wherein the etch recipe is valid for the calculated Cr loading factor or for a Cr loading factor that is within determined limits of the Cr loading factor.

6. The method of claim 5, wherein the loading factor is within a range of 15–25%, counting as Cr loading factors that closely resemble conditions for a Cr loading factor of 20%.

7. The method of claim 5, wherein the loading factor is within a range of 40–60%, counting as Cr loading factors that closely resemble conditions for a Cr loading factor of 50%.

8. The method of claim 5, wherein the loading factor is within a range of 70–90%, counting as Cr loading factors that closely resemble conditions for a Cr loading factor of 80%.

9. A method for the creation of a pattern of opaque material over the substrate of a photolithographic exposure mask, comprising:

determining several dry-etch recipes, whereby these several dry-etch recipes provide optimum CD performance for a number of different fixed pattern loading recipes such as 20%, 50% and 80%, said fixed pattern loading comprising forbidden surface areas;

calculating total Cr etch loading for a given product;

deriving, from the calculated total Cr etch loading a residue and useless area on the photolithographic mask;

determining a pattern of Cr etching by calculating a loading factor X, whereby X=(Cr etching area/total mask area)*100%, whereby 0%<X<100%;

performing, for values of X=20% and 50% and 80%, a first exposure;

if for standard Cr etch recipes of respectively A=20%, B=50% or C=80%, if respectively values of X<20% or <50% or <80%, determine if enough dummy pattern can be provided to meet the criteria of X+Y=20% or 50% or 80%;

if the latter criteria can be met with the dummy pattern the second exposure is performed; and separating, if the latter criteria cannot be met, the original patterns into pattern B and pattern C.

10. The method of claim 9, the forbidden area of the surface of the exposure mask being defined by a Scanner and by a Product Pattern.

11. The method of claim 9, whereby 0%<X<100%, whereby X is defined as being 20%, 50%, 80% or as being 18%, 35%, 75%, this latter determination being dependent on performance of actual chrome etch recipes and actual product patterns.

12. The method of claim 9, whereby X+Y=[(Cr etching area+Y dummy etching areas)/total mask area]*100%, while Y=(Y dummy etching area/total mask areas)*100%, thereby providing for converting different Cr etch recipes for Cr etch loading products into fixed etch recipes of for instance 20% or 50% of 80%.

13. The method of claim 9, wherein pattern A=39%, a C pattern being equal to 19%, by subtracting the C pattern (of 19%) from the A pattern (of 39%), a B pattern of 20% being obtained.

* * * * *